(12) United States Patent
Gupta et al.

(10) Patent No.: US 7,730,432 B1
(45) Date of Patent: Jun. 1, 2010

(54) METHOD AND SYSTEM FOR RESHAPING A TRANSISTOR GATE IN AN INTEGRATED CIRCUIT TO ACHIEVE A TARGET OBJECTIVE

(75) Inventors: Puneet Gupta, Santa Clara, CA (US); Andrew Kahng, Del Mar, CA (US); Dave Reed, Los Altos, CA (US)

(73) Assignee: Tela Innovations, Inc., Campbell, CA (US)

( * ) Notice: Subject to any disclaimer, the term of this patent is extended or adjusted under 35 U.S.C. 154(b) by 472 days.

(21) Appl. No.: 11/391,771

(22) Filed: Mar. 28, 2006

Related U.S. Application Data

(60) Provisional application No. 60/666,385, filed on Mar. 30, 2005.

(51) Int. Cl.
*G06F 17/50* (2006.01)
(52) U.S. Cl. ............... 716/2; 716/1; 716/9; 716/19
(58) Field of Classification Search ............ 716/1, 716/2, 9, 19
See application file for complete search history.

(56) References Cited

U.S. PATENT DOCUMENTS

| | | | | |
|---|---|---|---|---|
| 5,424,985 | A * | 6/1995 | McClure et al. ............. | 365/194 |
| 6,091,845 | A | 7/2000 | Pierrat et al. | |
| 6,297,668 | B1 * | 10/2001 | Schober ..................... | 326/101 |
| 6,306,710 | B1 * | 10/2001 | Long et al. .................. | 438/279 |
| 6,566,710 | B1 * | 5/2003 | Strachan et al. ............. | 257/341 |
| 6,928,635 | B2 | 8/2005 | Pramanik et al. | |
| 6,931,617 | B2 | 8/2005 | Sanie et al. | |
| 6,954,918 | B2 | 10/2005 | Houston | |
| 6,968,527 | B2 | 11/2005 | Pierrat et al. | |
| 6,993,741 | B2 | 1/2006 | Liebmann et al. | |
| 7,149,999 | B2 | 12/2006 | Kahng et al. | |
| 7,175,940 | B2 | 2/2007 | Laidig et al. | |
| 7,222,328 | B2 | 5/2007 | Hasumi et al. | |
| 7,441,211 | B1 | 10/2008 | Gupta et al. | |
| 7,487,475 | B1 | 2/2009 | Kriplani et al. | |
| 7,523,429 | B2 | 4/2009 | Kroyan et al. | |

(Continued)

FOREIGN PATENT DOCUMENTS

JP   2002-258463   9/2002

(Continued)

OTHER PUBLICATIONS

Sreedhar, A. Kundu, S. "*Statistical Yield Modeling for Sub-wavelength Lithography*", Dept. of Electr. & Comput. Eng., Univ of Massachusetts at Amherst, Amherst, MA This paper appears in: Test Conference, 2008. ITC 2008. IEEE International Publication Date: Oct. 28-30, 2008, pp. 1-8.

(Continued)

*Primary Examiner*—Thuan Do
(74) *Attorney, Agent, or Firm*—Martine Penilla & Gencarella, LLP

(57) ABSTRACT

The present invention provides a method and system for designing an integrated circuit (IC). The IC comprises a plurality of cells, and each of the cells comprises a plurality of transistors. The method achieves a target objective of a transistor, of a cell, or of part of or the entire IC. The method of designing the IC includes reshaping a basic shape of the transistor. The method includes determining a reshaping bias solution of the transistor. The method further includes modifying the basic shape of the transistor channel, based on the reshaping bias solution, and preparing a reshaped layout design.

5 Claims, 12 Drawing Sheets

U.S. PATENT DOCUMENTS

| | | |
|---|---|---|
| 2003/0212966 A1 | 11/2003 | Cadouri |
| 2003/0229881 A1 | 12/2003 | White et al. |
| 2005/0186746 A1* | 8/2005 | Lee et al. .................... 438/300 |
| 2006/0101370 A1 | 5/2006 | Cui et al. |
| 2006/0150132 A1* | 7/2006 | Gupta ........................... 716/5 |
| 2007/0150847 A1 | 6/2007 | Ikeda |
| 2007/0234252 A1 | 10/2007 | Visweswariah et al. |
| 2008/0046846 A1 | 2/2008 | Chew et al. |
| 2008/0127029 A1 | 5/2008 | Graur et al. |
| 2008/0148216 A1 | 6/2008 | Chan et al. |
| 2009/0024974 A1 | 1/2009 | Yamada |
| 2009/0055788 A1 | 2/2009 | Cote et al. |
| 2009/0077524 A1 | 3/2009 | Nagamura et al. |
| 2009/0106714 A1 | 4/2009 | Culp et al. |

OTHER PUBLICATIONS

Puneet Gupta, UC San Diego, La Jolla; Andrew B. Kahng, UC San Diego, La Jolla, "*Manufacturing-Aware Physical Design*", International Conference on Computer Aided Design archive; Proceedings of the 2003 IEEE/ACM International conference on Computer-aided design table of contents p. 681; Year of Publication: 2003; Publisher: IEEE Computer Society Washington, DC, USA.

Axelrad, V. Cobb, N. O'Brien, M. Boksha, V. Do, T. Donnelly, T. Granik, Y. Sahouria, E. Balasinski, A.; Sequoia Design Syst., Woodside, CA; "*Efficient full-chip yield analysis methodology for OPC-corrected VLSI designs*", This paper appears in: Quality Electronic Design, 2000. ISQED 2000. Proceedings. IEEE 2000 First International Symposium on Publication Date: 2000; pp. 461-466, San Jose, CA, USA.

"*Manufacturing-aware design helps boost IC yield*"; Website: http://www.eetimes,com/news/design/features/showArticle.jhtml?articleID=47102054; Publication date: Sep. 9, 2004.

Gupta P. et al., "*Joining the Design and Mask Flows for Better and Cheaper Masks*," Proc. 24$^{th}$ BACUS Symposium on Photomask Technology and Management, Sep. 2004, 12 pages.

Gupta P. et al., "*Selective Gate-Length Biasing for Cost-Effective Runtime Leakage Control*," DAC 2004, Jun. 7-11, 2004, pp. 327-330, San Diego, CA.

Clark L. et al., "*Managing Standby and Active Mode Leakage Power in Deep Sub-micron Design*", Proceedings IEEE International Symposium on Low Power Electronic Design, 2004, pp. 275-279.

\* cited by examiner

METHOD AND SYSTEM FOR RESHAPING A TRANSISTOR GATE IN AN INTEGRATED CIRCUIT TO ACHIEVE A TARGET OBJECTIVE

This application claims priority of U.S. provisional application Ser. No. 60/666,385 filed on Mar. 30, 2005.

BACKGROUND OF THE INVENTION

1. Field of the Invention

This invention relates in general to the design of integrated circuits (ICs) and in particular to designing IC layouts.

2. Description of the Related Art

In the design and manufacture of modern Integrated Circuits (ICs), a number of advanced technologies are applied in concert to achieve uniformity and fidelity of all the patterned IC features, including transistors. Such advanced technologies span computer-aided design tools, photomask design tools and fabrication equipment, as well as lithography tools in the foundry. In all of these technologies, the simulation model of the transistor is based on idealized transistor channel widths and lengths. The transistor channel is modeled for simulation purposes as a rectangle. Further, the physical realization of the transistor channel, as represented in a circuit designer's computer-aided layout tool, is again a rectangle, e.g., the rectangular region where a polysilicon shape overlaps a diffusion shape. Subsequently, reticle enhancement techniques (RETs), notably those including optical proximity correction (OPC), sub-resolution assist features (SRAFs) and phase-shifting masks (PSM), all aim to optimize a mask design so that the transistor shape printed on the wafer has maximum fidelity to the rectangular drawn or designed shape. To summarize, in the vast majority of IC design and manufacturing flows, transistors are modeled, designed, drawn and printed so that their gates have perfectly rectangular channels.

With modern deep-submicron or decananometer-scale IC manufacturing processes, a very serious problem is that of leakage current, and therefore leakage power dissipation. It has been projected that in 65 nm process technologies, up to half of the power consumption of an IC can be static power due to leakage mechanisms. Static power is also known as "useless" power since it is dissipated without achieving any advancement of useful computations by the circuit. Components of static power dissipation include subthreshold leakage current, gate leakage or direct tunneling current, junction leakage or tunneling current, hot carrier injection current, gate-induced drain leakage current, punch-through current, etc. Such currents can exhibit sensitivities to environmental or manufacturing process variations. For example, subthreshold leakage current grows exponentially with a decrease in transistor channel length.

Present-day IC design and manufacturing processes only draw, layout and manufacture uniformly rectangular devices that meet prescribed transistor channel dimensions. Therefore, today's IC design and manufacturing processes fail to exploit a valuable degree of freedom, whereby not only the length and width but more generally, the shape of the transistor channel can be optimized to achieve a target objective with respect to performance, power, reliability, manufacturing yield, and other metrics. Due to this failing, today's IC design and manufacturing processes suffer unnecessary loss of performance, power, reliability, and parametric yield in manufactured ICs.

There exists a need for a method and system and that can reshape the transistor channel to improve the performance and leakage power of manufactured ICs. The method and system should be capable of improving the reliability, manufacturing yield and parametric yield of manufactured ICs. The method and system should also be capable of being used within the existing IC design cycle, to improve the design of the IC and make use of existing and known circuit analysis tools.

SUMMARY OF THE INVENTION

An object of the invention is to achieve a performance objective and a leakage objective in an integrated circuit (IC), based on reshaping the basic shape of a transistor in the IC.

Various embodiments of the present invention provide a method and system for designing the IC, which includes a plurality of cells. Each of the plurality of cells includes a plurality of transistors. The method determines a reshaping bias solution for a transistor. A basic shape of a transistor channel is reshaped according to such a reshaping bias solution to achieve a target objective that comprises a performance or leakage or other objective. The reshaped layout design is then prepared, based on the reshaping bias solution.

In accordance with an embodiment, the system includes a metrics optimizer, a bias data generator, and a layout-designing module. The metrics optimizer sets the target objective and checks whether the target objective is achieved. The bias data generator determines the reshaping bias solution of the transistor, while the layout-designing module prepares the reshaped layout design.

Various embodiments of the present invention offer the following advantages. Reshaping the basic shape of transistor channels leads to an Integrated Circuit (IC) that will have reduced leakage power without having a considerable impact on its performance characteristics. In addition the IC can also be designed to improve objectives including with respect to reliability, capacitance, IC parametric yield and manufacturing yield. Various embodiments of the invention are in accordance with existing IC design processes (LOCOS or STI, etc.). The present invention is also capable of being used within the existing IC design cycle, with reshaping performed at the design stage in either the full-custom design or semi-custom design context.

BRIEF DESCRIPTION OF THE DRAWINGS

So that the above-recited elements of the present invention can be understood in detail, a more particular description of the invention, briefly summarized above, may be had by reference to various embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
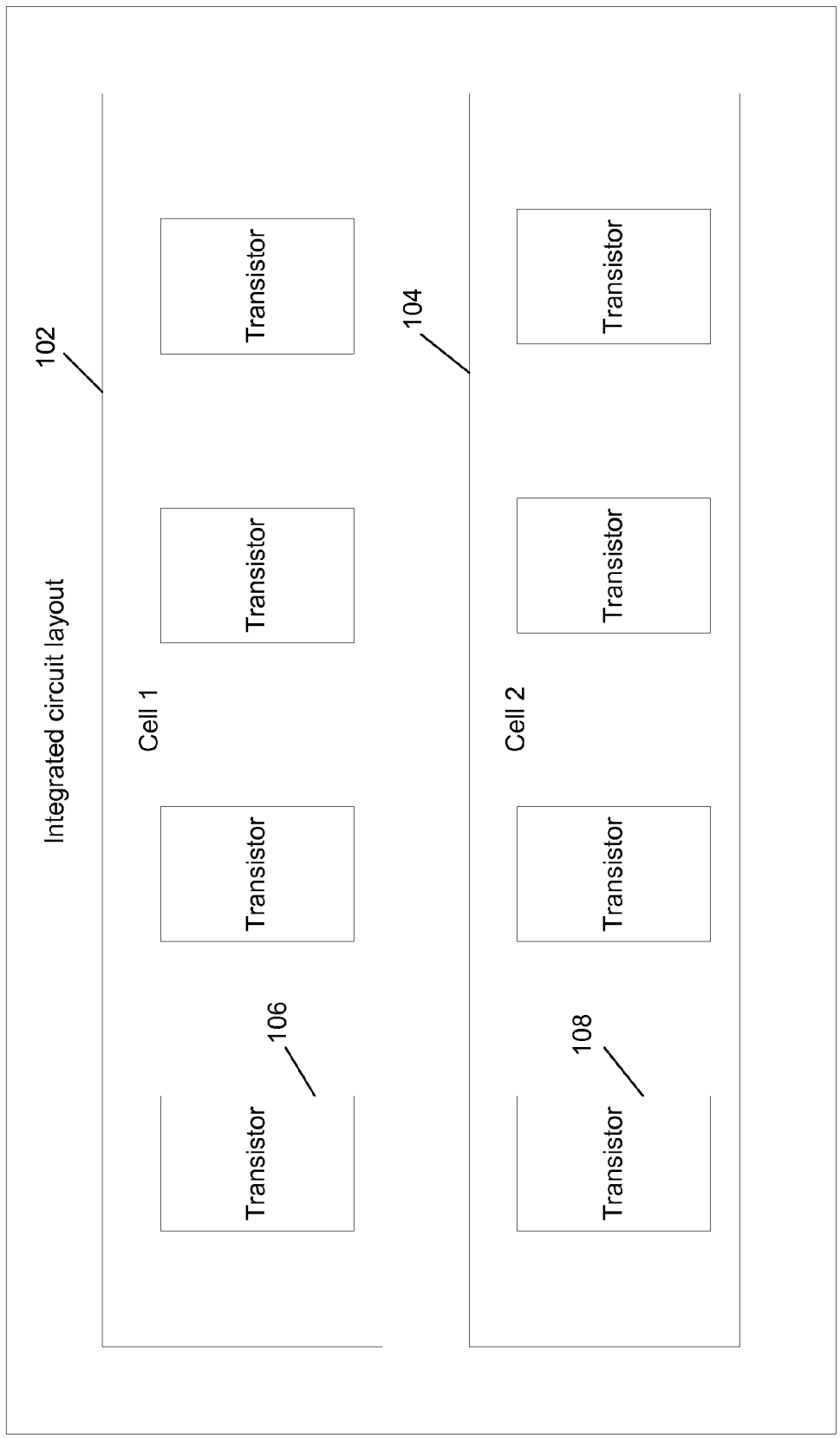
FIG. 1 is a block diagram illustrating exemplary elements of an integrated circuit, in accordance with an embodiment of the present invention.

The present invention relates to a method and system for designing an integrated circuit (IC), which includes a plurality of cells. Each of the plurality of cells includes a plurality of transistors. The present invention provides for a method to achieve one or more target objectives in the IC. The target objectives include, but are not limited to, a performance objective, a leakage objective, capacitance, reliability, a manufacturing yield, and an IC parametric yield. Each of the target objectives includes the target values of a plurality of transistor metrics. For example, the performance objective of a transistor is characterized by the drive current ($I_{on}$) of that transistor, and the leakage objective of a transistor is characterized by the leakage current ($I_{off}$) of that transistor. Similarly, capacitance is characterized by a plurality of capacitances, such as the transistor gate to transistor drain capacitance, the transistor gate to transistor channel capacitance, and the transistor gate to transistor source capacitance. The plurality of transistor metrics depends upon various factors, including the transistor channel width and the transistor channel length. For example, $I_{on}$ the transistor is a function of the ratio of the transistor channel width to the transistor channel length. $I_{off}$ of a transistor is exponentially dependent on the transistor channel length, but is linearly dependent on the transistor channel width. Similarly, capacitance is a function of transistor channel area, which is a product of transistor channel width and length.

To achieve the target objective(s), the IC design process of the present invention includes reshaping a basic shape of the transistor, which includes modifying the basic shape of its channel. The basic shape of the transistor channel is typically a rectangle. For example, if the target objective is set to achieve a combined performance and leakage objective such that a leakage current ($I_{off}$) is reduced without any significant impact on a drive current ($I_{on}$), then the target objective can be achieved by reshaping the basic shape of the transistor channel. For the purpose of this description, the method of the present invention is being described to achieve the performance and leakage objective of the IC. It will be apparent to a person skilled in the art that reshaping the transistor channel will also achieve other target objectives.

The target objective can be considered at a chip level of the IC design. In other words, the target objective can be set for a part of the IC or for the complete IC. In an embodiment of the present invention, considering the target objective at the chip level includes setting a value for a target performance (as manifested, for example, as chip performance or frequency) and a target leakage of a part of the IC, or for the complete IC. The target objective can also be considered at the cell level of the IC design. In an embodiment of the present invention, considering the target objective at the cell level of the IC design includes setting a value for the target delay (as manifested, for example, as the drive strength) and the target leakage of at least one cell of the plurality of cells. Similarly, the target objective can also be considered at a transistor level of the IC design. In an embodiment of the present invention, considering the target objective at the transistor level of the IC design includes setting a value for the target $I_{on}$ and the target $I_{off}$ of at least one transistor of the plurality of transistors.

In another embodiment of the present invention, the target objective can be achieved in a performance-driven manner. For example, the target objective will be applied only to those transistors having a sufficient timing slack, such that the reshaping maintains the IC parametric yield.

FIG. 1 is a block diagram illustrating the exemplary elements of an integrated circuit, in accordance with an embodiment of the present invention. FIG. 1 shows an integrated circuit (IC) 100, which includes a cell 102 and a cell 104. Only cells 102 and 104 are shown for exemplary purposes. It will be apparent to those skilled in the art that the integrated circuit can also include other cells (not shown in FIG. 1). Cell 102 includes a transistor 106 and other transistors. Similarly, cell 104 includes a transistor 108 and other transistors.

Figure 2:
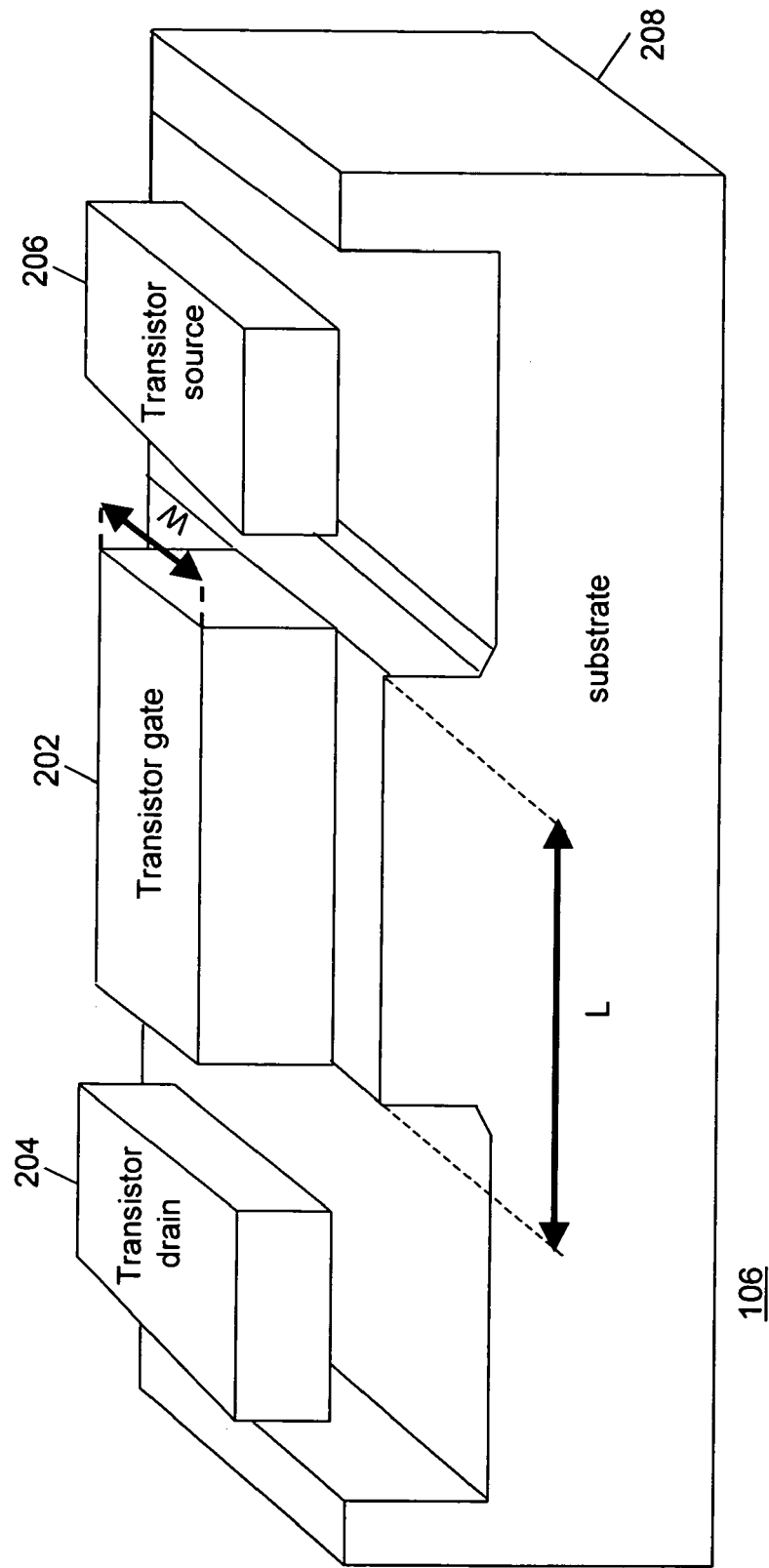
FIG. 2 is a block diagram illustrating an exemplary transistor in an integrated circuit, in accordance with an embodiment of the present invention.

FIG. 2 is a block diagram illustrating transistor 106 in IC 100, in accordance with an embodiment of the present invention. In FIG. 2, a transistor gate 202, a transistor drain 204, a transistor source 206, and a substrate 208 are shown. A transistor channel is formed between transistor gate 202 and substrate 208. The transistor channel length is equal to the length of transistor gate 202, which is shown as 'L' in FIG. 2. Similarly, the transistor channel width is equal to the width of transistor gate 202, which is shown as 'W' in FIG. 2

Figure 3:
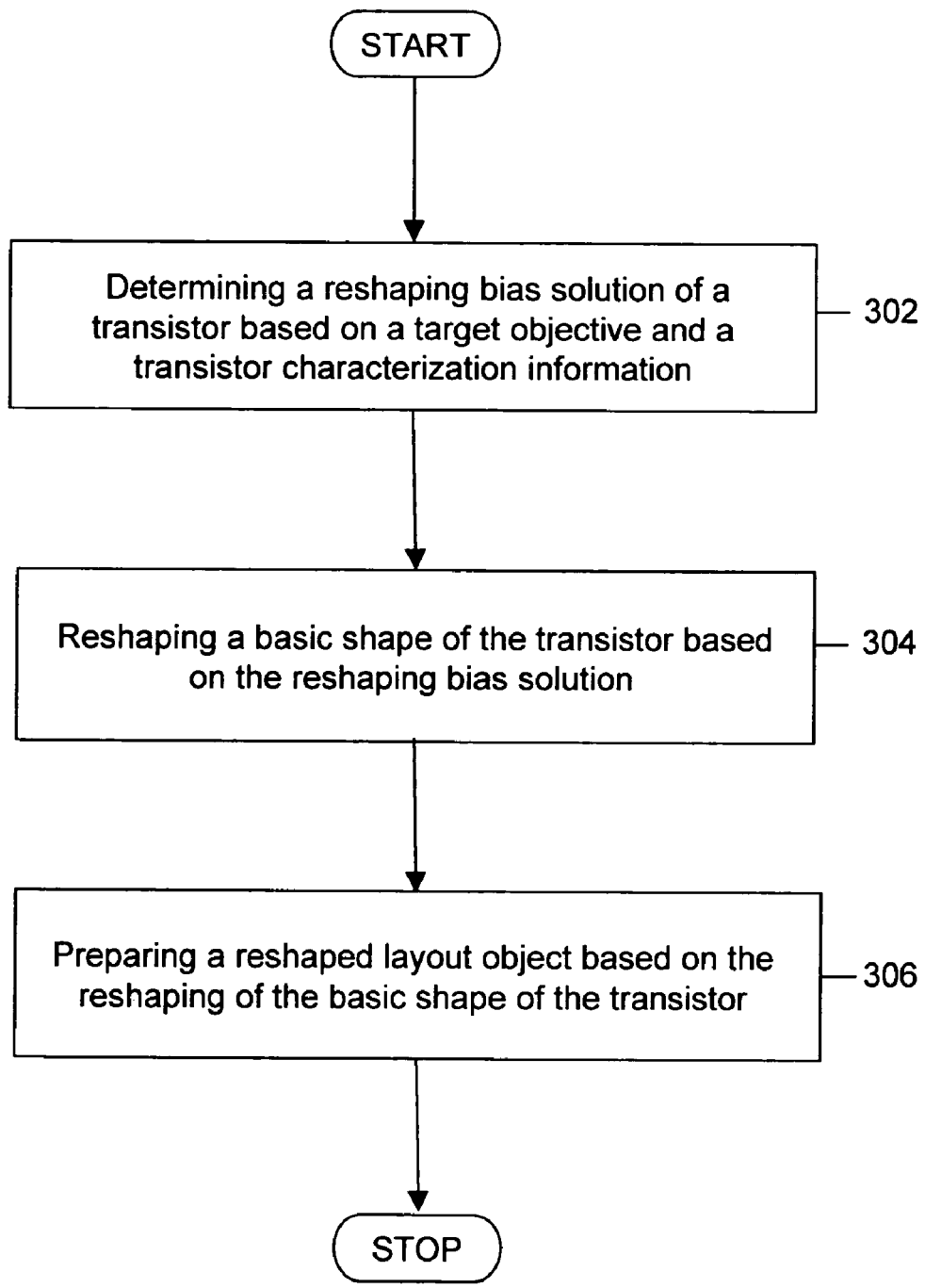
FIG. 3 is a flowchart of a method for designing an integrated circuit, in accordance with an embodiment of the present invention.

FIG. 3 is a flowchart of a method for designing an integrated circuit (IC), in accordance with an embodiment of the present invention. The IC includes a plurality of cells, and each of the plurality of cells includes a plurality of transistors. At step 302, a reshaping bias solution of at least one transistor from the plurality of transistors is determined, based on a target objective and a transistor characterization information. The target objective includes the target values of the plurality of transistor metrics of the manufactured IC. Examples of the plurality of transistor metrics include, but are not limited to, a drive current ($I_{on}$), a leakage current ($I_{off}$), reliability, capacitance, manufacturing yield, and an IC parametric yield. In an embodiment of the present invention, the target objective is either a performance objective or a leakage objective or both. The transistor characterization information models the dependence of the plurality of transistor metrics on the positional and dimensional attributes of the transistor. The reshaping bias solution specifies a reshaped transistor channel. Upon application of the reshaping bias solution, e.g., through preparation of a reshaped layout, the transistor with the reshaped transistor channel meets the target objective. The reshaping bias solution is selected from a set of allowable biases. The set of allowable biases is a predetermined group of reshaped transistor channels. Each of the set of allowable biases has a non-rectangular shape. In an embodiment of the present invention, determining the reshaping bias solution of a transistor is an iterative process whereby each of the set of allowable biases can be tested until a stopping condition is met. The stopping condition is met when the target objective is achieved for a specific allowable bias. This specific allowable bias is then known as the reshaping bias solution. Determining the reshaping bias solution is explained further in conjunction with FIGS. 11 and 12.

At step 304, the basic shape of each of the at least one transistor is reshaped, based on the reshaping bias solution. Reshaping the basic shape of the at least one transistor includes reshaping a transistor channel. Typically, the basic shape of the transistor channel is rectangular. In an embodiment of the present invention, reshaping the at least one transistor comprises changing the shape of the transistor channel to conform to the reshaping bias solution. In other words, the basic (rectangular) transistor channel shape is changed to a non-rectangular shape. At step 306, a reshaped layout design is prepared, based on the reshaping of at least one transistor. The method can be utilized to design an IC by reshaping one or more transistor channels of a design layout obtained from an Electronic Design Automation (EDA) tool. In another embodiment, the above-given method can be embodied in an EDA tool such that a reshaped layout design produced by the EDA tool has improved transistor metrics.

In yet another embodiment of the present invention, the method of FIG. 3 can be applied to a drawn layout so as to prepare a reshaped layout design. The drawn layout is a layout representation of the plurality of transistors. In the reshaped layout design, the shape of the transistor channel of at least one of the plurality of transistors is non-rectangular. In another embodiment of the present invention, the method of FIG. 3 can be applied before the preparation of a drawn layout. In this embodiment, the drawn layout generated in accordance with the invention is a reshaped layout design.

In one embodiment of the invention, the method of FIG. 3 can be utilized to prepare an integrated circuit. The integrated circuit is designed using a standard-cell library. The standard-cell library includes a plurality of standard cells. Each of the plurality of standard cells includes at least one transistor. The standard-cell library is prepared by modifying a standard cell. Modifying the standard-cell includes reshaping a transistor such that the reshaped transistor has a non-rectangular shape.

Figure 4:
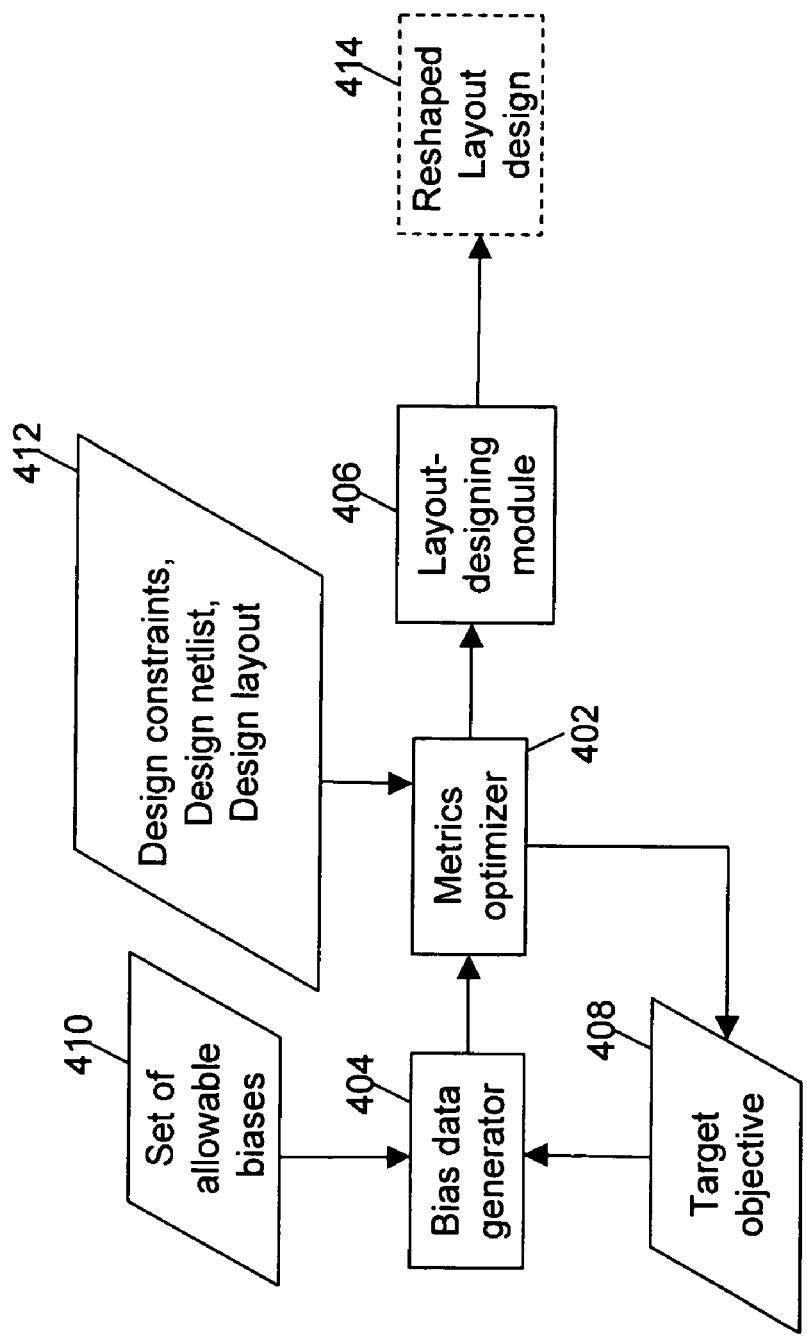
FIG. 4 is a block diagram of a system for designing an integrated circuit, in accordance with an embodiment of the present invention.

FIG. 4 is a block diagram of a system for designing an integrated circuit, in accordance with an embodiment of the present invention. FIG. 4 represents various system components for designing the IC. The system includes a metrics optimizer 402, a bias data generator 404, a layout-designing module 406, a target objective 408, a set of allowable biases 410, and design constraints, design netlist and design layout 412. In FIG. 4, parallelogram boxes represent inputs to the system components, while the dashed box represents the system output. For example, design constraints, design netlist and design layout 412 comprises an input to the metrics optimizer 402. Metrics optimizer 402 sets the value of target objective 408, based on design constraints, design netlist, and design layout 412. Target objective 408 can be either a performance objective or a leakage objective or both, capacitance, reliability, manufacturing yield, or IC parametric yield. The set of allowable biases 410 and target objective 408 are inputs to bias data generator 404, which determines the reshaping bias solution for a transistor. Further, layout-designing module 406 reshapes a transistor channel according to the reshaping bias solution and prepares a reshaped design layout 414.

Figure 5:
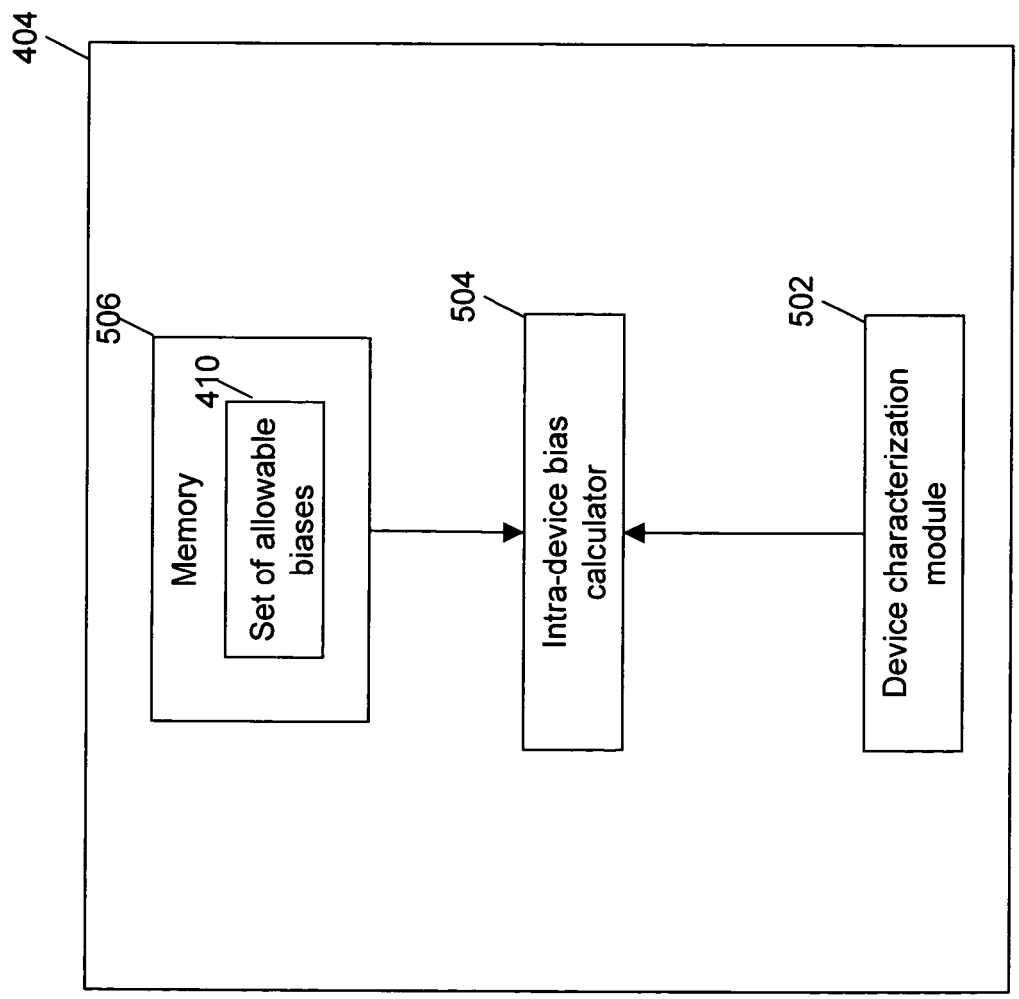
FIG. 5 is a block diagram of a bias data generator module, in accordance with an embodiment of the present invention.

FIG. 5 is a block diagram of a bias data generator 404, in accordance with an embodiment of the present invention. Bias data generator 404 includes a device-characterization module 502, an intra-device bias calculator 504, and a memory 506. Device characterization module 502 provides the transistor characterization information to intra-device bias calculator 504. The transistor characterization information includes the expected manufactured performance of the transistor for each of the set of allowable biases 410. Intra-device bias calculator 504 accepts transistor characterization information, the set of allowable biases 410, and the target objective 408 as inputs. From these inputs, intra-device bias calculator 504 selects the reshaping bias solution. In an embodiment of the present invention, device characterization module 502 further informs intra-device bias calculator 504 about the expected manufactured performance of the transistor for each of the set of allowable biases. The set of allowable biases 410 are stored in memory 506. The expected manufactured performance is the performance of the transistor or integrated circuit for an allowable bias, with allowances for errors made during the manufacturing procedure.

Figure 6:
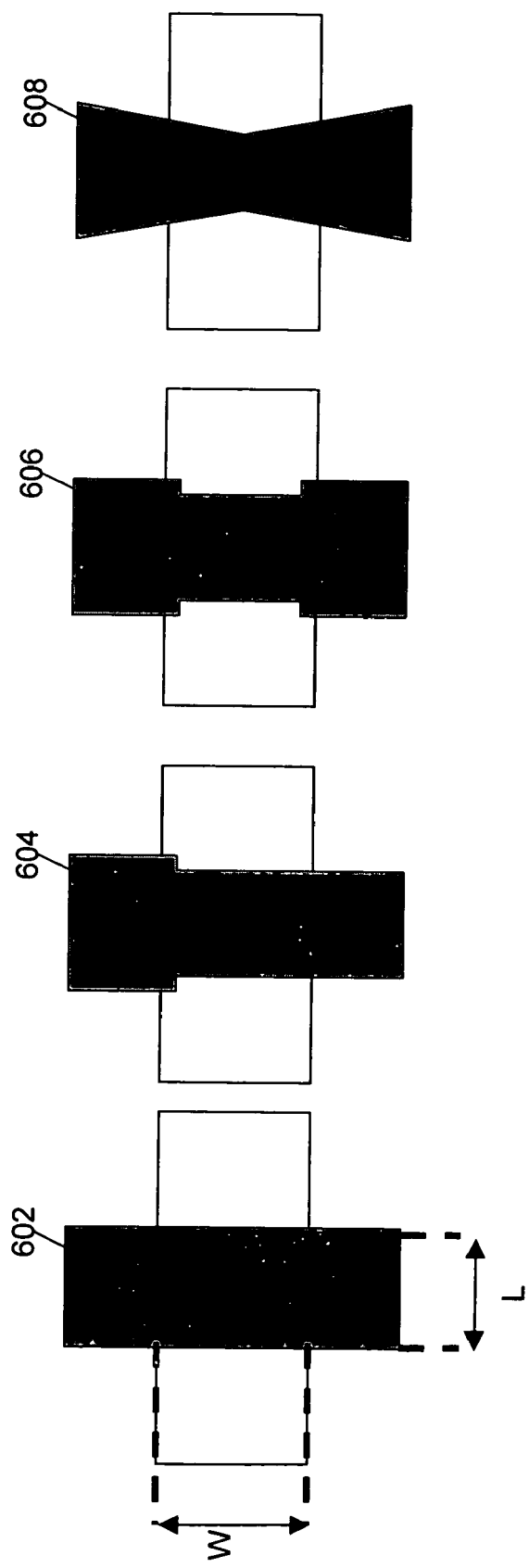
FIG. 6A is a diagram illustrating a shape of a transistor channel, in accordance with an embodiment of the present invention.
FIGS. 6B, 6C, and 6D are diagrams illustrating examples of a set of allowable bias, in accordance with an embodiment of the present invention.

FIG. 6A is a block diagram illustrating the basic shape of a transistor channel. In one embodiment of the invention the shape of a transistor channel in an integrated circuit is non-rectangular. The integrated circuit includes a plurality of cells; each of the plurality of cells includes a plurality of transistors. FIGS. 6B, 6C and 6D are block diagrams illustrating examples of non-rectangular shapes and allowable biases, in accordance with an embodiment of the present invention. The allowable biases 604 "T shaped", 606 "I shaped", 608 "X shaped' can belong to the set of allowable biases 410. The basic shape of the transistor channel is a rectangle, as shown in FIG. 6A. These allowable biases counter certain effects introduced due to non-nominal dimensions of the width and length of the transistor gate. Examples of these effects include the narrow-width effect, the well proximity effect and reverse narrow-width effect. These effects will be explained in conjunction with FIGS. 7 and 8.

Figure 7:
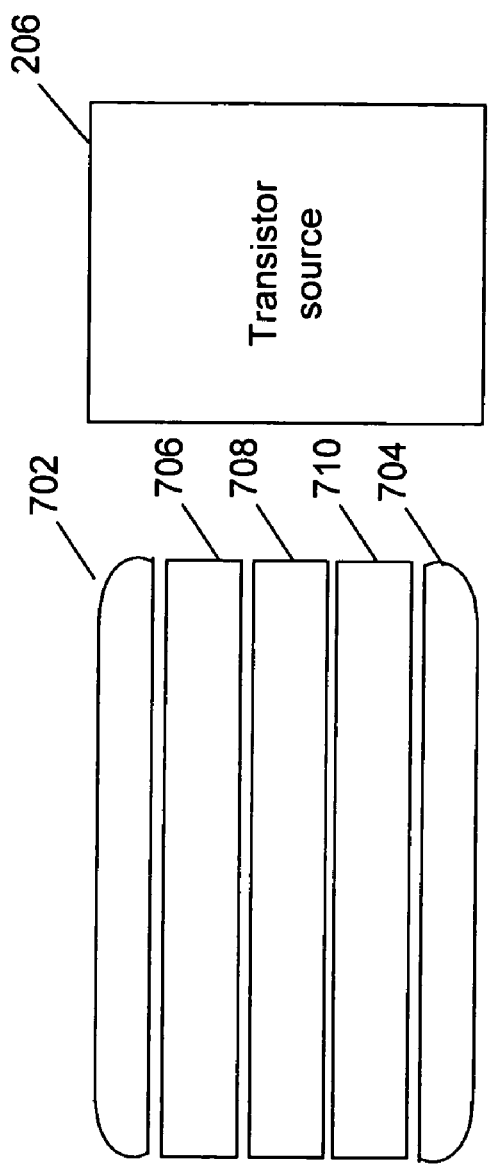
FIG. 7 is a block diagram illustrating the concept of slicing in a transistor, in accordance with an embodiment of the present invention.

FIG. 7 is a block diagram illustrating the concept of "slicing" in transistor 106, in accordance with an embodiment of the present invention. In the context of the present invention, slicing is described to illustrate the relationship between transistor parameters and position along the width of the transistor gate. These transistor parameters such as threshold voltage ($V_{th}$), leakage current ($I_{off}$) and drive current ($I_{on}$) all vary with respect to the location on the transistor gate. This illustrates that a single transistor gate is not homogeneous throughout its area. A transistor gate can have different values for transistor parameters, say, threshold voltage, at different points on the transistor gate. Transistor 106, shown in FIG. 7, is sliced along the width of the transistor channel. Slicing yields a set of smaller transistors. Each of the set of the smaller transistors is parallel to each other. FIG. 7 shows a top view of transistor drain 204, a top view of transistor source 206, and a plurality of transistor slices. The plurality of transistor slices include slice 702, slice 704, slice 706, slice 708 and slice 710. These slices are shown for exemplary purposes. It will be apparent to those skilled in the art, that any number of slices can be considered. Slices 702 and 704 represent the edges of the un-sliced transistor gate. Slices 706, 708 and 710 represent the center of the un-sliced transistor gate.

Apart from the slicing of the transistor channel, the shape of the transistor channel of a manufactured transistor also deviates from the shape of a transistor channel of an idealized transistor. Let the drawn (idealized) channel width of the transistor be $W_{drawn}$, and the effective (manufactured) channel width of the transistor be $W_{eff}$. Similarly, let the drawn (idealized) channel length of the transistor be $L_{drawn}$, and the effective (manufactured) channel length of the transistor be $L_{eff}$. The slices that are closer to the gate edges suffer from "edge effects". The major cause of edge effect is the 'narrow-width effect' which causes slices near the edge of the transistor to behave differently compared to slices that are away from the edge. For example, slices 702 and 704 in FIG. 7 suffer from the narrow-width effect.

The narrow-width effect causes a change in the threshold voltage ($V_{th}$) of a transistor. This change is caused due to the presence of a fringing field. The fringing field is created due to a contact between the transistor gate and the transistor drain. The contact causes the total area where depletion takes place to be larger than the expected depletion region. The narrow-width effect is especially pronounced when the transistor channel width is reduced. With the reduction of the transistor channel width, the depletion region caused by the fringing field becomes comparable to the depletion region formed by the vertical field. Therefore, there is an increase in the total area where depletion takes place. This, in turn, increases $V_{th}$. This effect can be modeled by the following equation:

$$\Delta V_{th}(\text{narrow width}) = -\frac{0.5 \times DVT0W}{\cosh\left(DVT1W \times \frac{L_{eff} W_{eff}}{I_{tw}}\right) - 1} \times (V_{bi} - \Phi_s) \quad (1)$$

where:

$\Delta V_{th}$(Narrow-width) represents an increase in threshold voltage due to the narrow-width effect;

DVT0W and DVT1W are constants;

$V_{bi}$ represents the built-in voltage of the source/drain junction; and $\Phi_s$ represents surface potential.

Further explanation of the equation (1) given above can be found with the documentation of the narrow-width effect in the user manual of the BSIM 4.5.0 device model (Chapter 2, Pages 2-11) published in July, 2005 by the University of California at Berkeley. Equation (1) implies that slices closer to the transistor gate edges of the original transistor shape have different effects on $I_{on}$ or $I_{off}$ than slices that are in the middle of the original transistor shape. Further, the equation (1) clearly indicates the dependence of the threshold voltage $V_{th}$ on effective transistor dimensions $L_{eff}$ and $W_{eff}$.

The narrow-width effect is also dependent on the isolation process used for designing ICs. For non-recessed and semi-recessed (e.g., LOCOS) isolation processes, the threshold voltage ($V_{th}$) increases as the transistor channel width decreases. Therefore, the narrow-width effect can be countered by reshaping basic shape 602 to a non-rectangular shape as shown in FIGS. 6B, 6C and 6D. As mentioned earlier, reshaping of basic shape 602 can also be used to counter other effects such as the reverse narrow-width effect and the well proximity effect.

Figure 8:
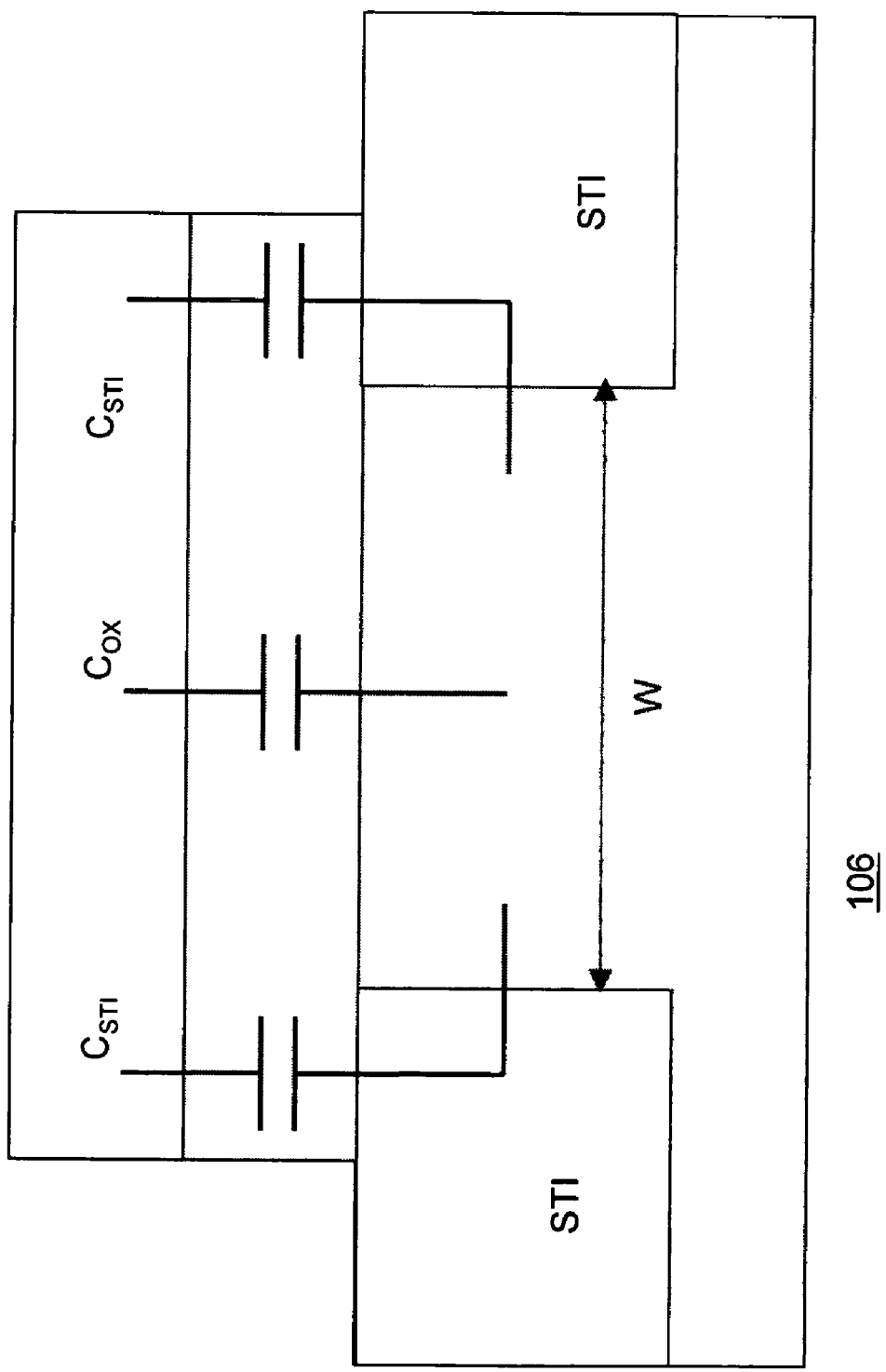
FIG. 8 is a schematic diagram illustrating a cross section of a transistor showing Shallow Trench Isolation (STI) edges and fringing capacitance, in accordance with an embodiment of the present invention.

FIG. 8 is a schematic diagram illustrating a cross section of a transistor 106 showing Shallow Trench Isolation (STI) edges and fringing capacitances, in accordance with an embodiment of the present invention. STI edges are the deposited oxide edges ($SiO_2$) in the STI technology while fringing capacitance is the capacitance between the transistor gate and active region. Transistor gate-to-oxide capacitance ($C_{ox}$) and STI fringing capacitance ($C_{sti}$) are also shown in FIG. 8. In the STI process of IC manufacture, it is observed that the threshold voltage decreases as the transistor channel width decreases. This effect is the reverse narrow-width effect (RNWE). In RNWE, $V_{th}$ decreases as the transistor channel width decreases. The RNWE can be explained by the parasitic fringing capacitances as shown in FIG. 8 between transistor gate, STI sidewall, and active area where there is transistor gate extension over the isolation area.

The well proximity effect is characterized by the threshold voltage increasing when the transistor channel is close to the edge of a well-resist mask. This happens because extra channel dopants from lateral scattering off the resist sidewall enter the active area during well implantation. In other words, ions bounce off the resist sidewall and enter the active region. The well proximity effect is dependent on the distance between the channel and the well-mask edge, the orientation of the transistor, and the energy of the implanted ions. Narrow and long-channel transistors are prone to the well proximity effect. It is apparent that the threshold voltage of the transistor is affected by fringing capacitance due to the line-end extension, and by dopant scattering due to Shallow Trench Isolation (STI) edges and the well proximity effect. Transistor gate edges are heavily affected by these phenomena, which become less pronounced towards the center of the transistor gate.

The well proximity effect arises due to the alteration of the threshold voltage because of the scattering of ions into a transistor gate. As mentioned earlier, the narrow-width effect arises due to the increase in threshold voltage when the width of a transistor becomes narrow. It is obvious that incremental contributions to the total values of $I_{on}$ and $I_{off}$ will vary according to the effective length $L_{eff}$ values that occur across the effective width $W_{eff}$ of the transistor. Therefore, any objectives that depend on the values of these transistor parameters can be achieved by reshaping the basic shape of the transistor. In an embodiment of the present invention, reshaping the basic shape of the transistor comprises changing the basic shape of the transistor channel into the reshaping bias solution. The reshaping bias solution is selected from the set of allowable biases. FIGS. 6B, 6C and 6D represent examples of reshaping bias solutions in the set of allowable biases. The allowable biases shown are exemplary. It will be apparent to a person skilled in the art that the set of allowable biases can include allowable biases other than those shown in FIGS. 6B, 6C and 6D. Each of the set of allowable biases has a shape that is different than the (rectangular) basic shape. In other words, each of the set of allowable biases has a varying length along its width. The values of $I_{on}$ and $I_{off}$ are based upon the lengths attained by each of the set of allowable biases along its width. Therefore, the values of $I_{on}$ and $I_{off}$ can be controlled by changing the basic shape of the transistor channel by reshaping the bias solution. A variation of the shape of the transistor channel near the transistor gate edges has a greater impact on $I_{off}$ than a similar variation at the center of the transistor channel. In other words, the position of any reshaping of the basic shape of the transistor channel is significant, and affects transistor performance and leakage objectives.

For example, an allowable bias 604, shown in FIG. 6B, has one end of the channel extended such that the extended end is biased to have a greater length. The value of $I_{on}$ is less for allowable bias 604 than for basic shape 602. This is further described in conjunction with FIGS. 11 and 12. Similarly, an allowable bias 606, shown in FIG. 6C, has both ends of the channel extended, such that both ends are biased to have larger lengths. Reshaping the basic shape of the channel by having allowable bias 606 as the transistor channel can reduce the value of $I_{off}$ even more. Finally, an allowable bias 606, shown in FIG. 6D, has a non-rectilinear shape that achieves the greatest reduction in the value of $I_{off}$ among the shown allowable biases 602, 604, 606, and 606.

Figure 9:
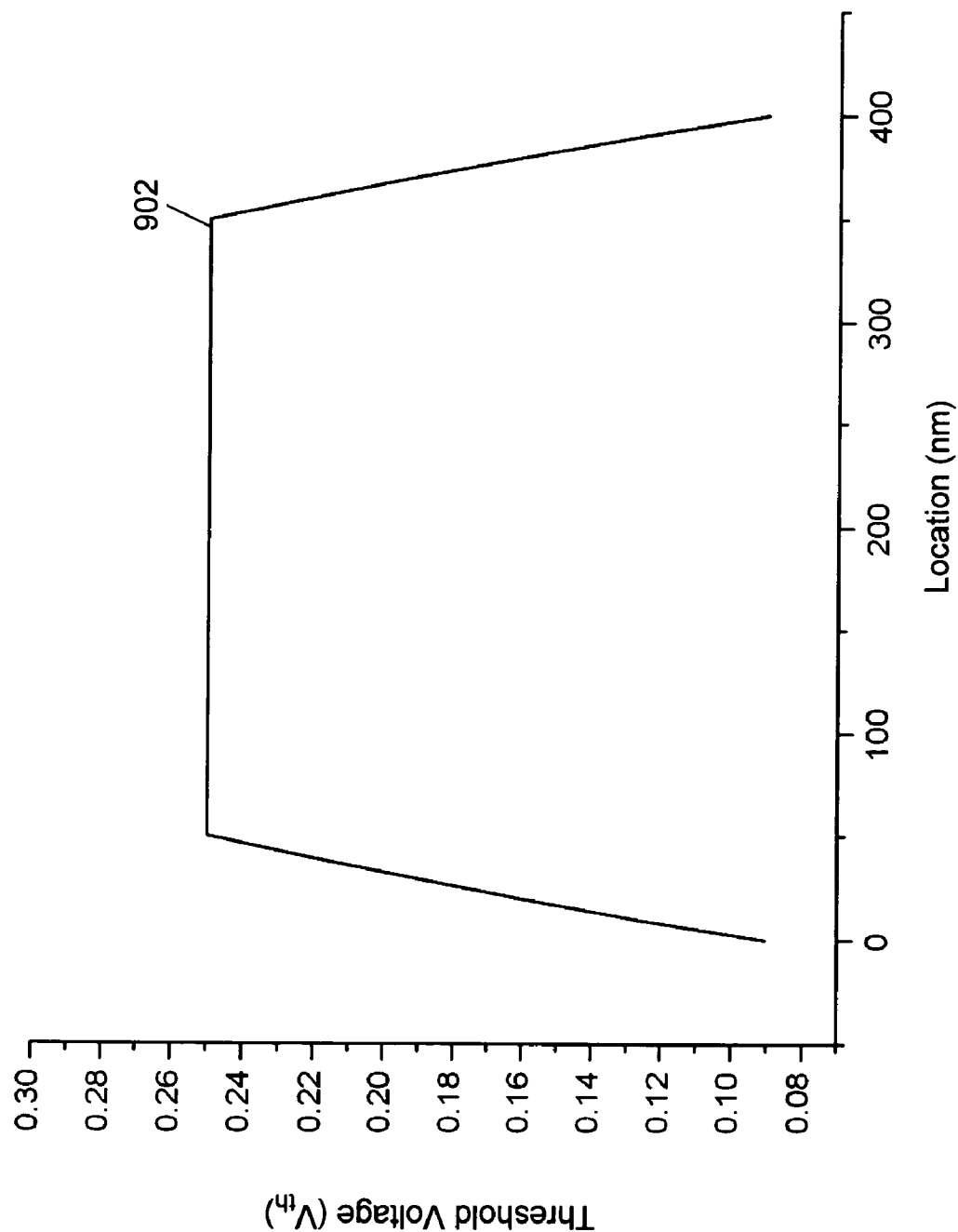
FIG. 9 is a graph illustrating variation of threshold voltage ($V_{th}$) along the transistor channel width, in accordance with an embodiment of the present invention.

FIG. 9 is an exemplary graph illustrating variation of threshold voltage ($V_{th}$) along the transistor channel width, in accordance with an embodiment of the present invention. The threshold voltage ($V_{th}$) is plotted against a location taken from one end of the transistor gate edge to illustrate the reverse narrow-width effect (RNWE). FIG. 9 includes a curve 902. Curve 902 represents a relationship between $V_{th}$ and the distance from one end of the transistor gate of width 400 nm. It can be seen from curve 902 that the threshold voltage near the edges of the transistor gate is smaller than at the center of the transistor gate width. Also the "edge-effect" dies down quickly and the threshold voltage is constant around the center of the transistor gate width. Curve 902 can be used to select an allowable bias from a set of allowable biases 410. The variation of $V_{th}$ along the transistor channel width for the narrow-width effect is substantially opposite to the variation shown in FIG. 9. It will be apparent to those skilled in the art that similar graphs can be drawn for all effects. The graphs can then be used to select a reshaping bias solution from the set of allowable biases 410.

Figure 10:
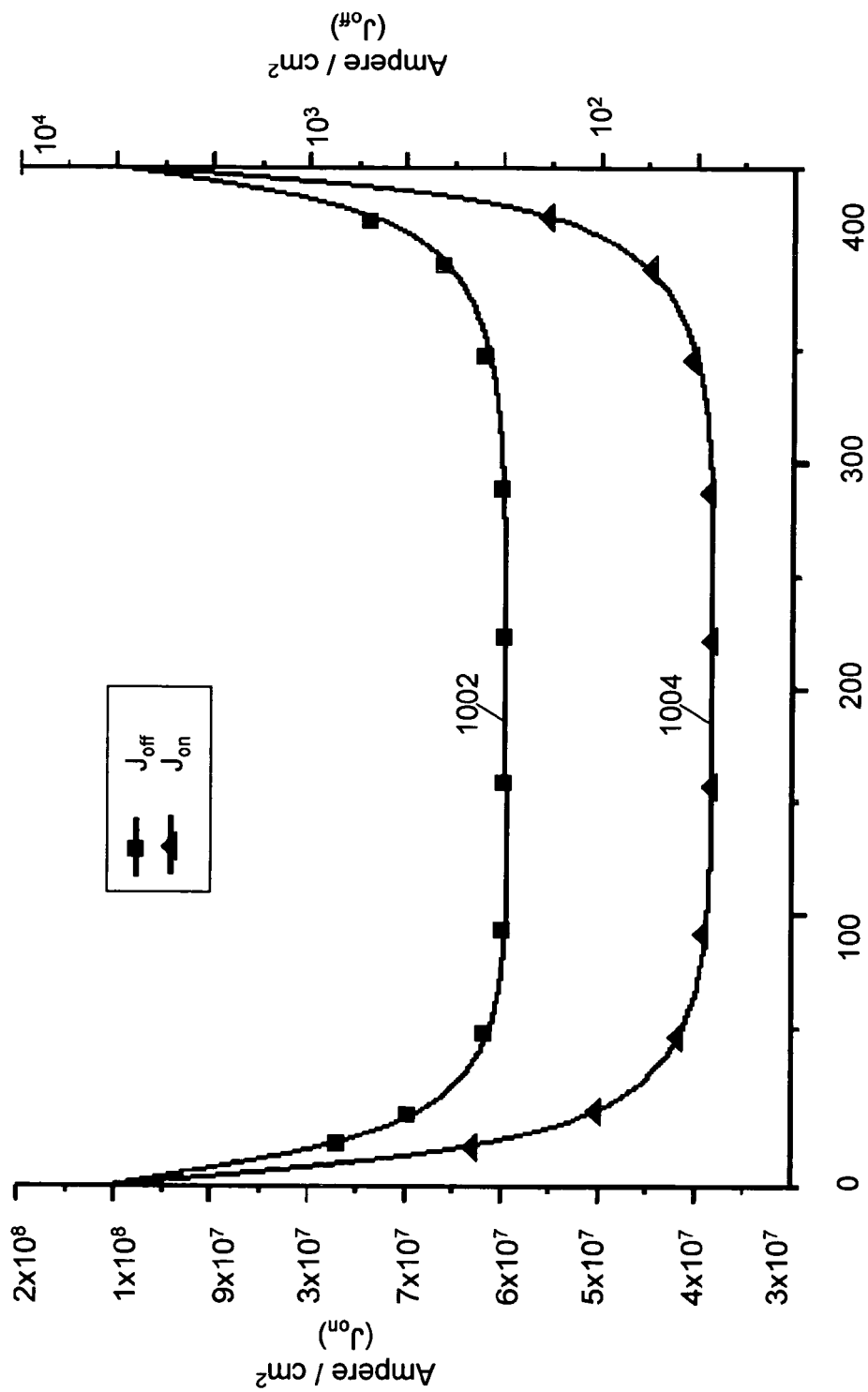
FIG. 10 is a graph illustrating a variation of a drive current density ($J_{on}$) and a leakage current density ($J_{off}$) along the transistor channel width, in accordance with an embodiment of the present invention.

FIG. 10 is an exemplary graph illustrating a variation of drive current density ($J_{on}$) and leakage current density ($J_{off}$) along the transistor channel width, in accordance with an embodiment of the present invention. FIG. 10 includes a curve 1002 and a curve 1004. Curve 1002 represents a relation of the leakage current density ($J_{off}$) to the distance across the transistor channel width. The distance is taken from one end of the transistor. Similarly, curve 1004 represents a relation of the drive current density ($J_{on}$) to the distance across the transistor channel width. The width of the transistor is here taken as 400 nm for exemplary purposes. It is obvious from FIG. 10 that the values of $J_{off}$ and $J_{on}$ are approximately constant in the center of the transistor channel width. For example, the values of $J_{off}$ and $J_{on}$ are approximately constant when the distance from one end of the edge of the transistor is 100 nm, 200 nm or 300 nm. The values of $J_{off}$ and $J_{on}$ increase near the transistor gate edges. For example, the values of $J_{off}$ and $J_{on}$ both increase when the distance from any one end of the edge of the transistor is less than 100 nm. The variation of $J_{on}$ and $J_{off}$ can be used to select a reshaping bias solution from the set of allowable bias solutions 410.

Figure 11:
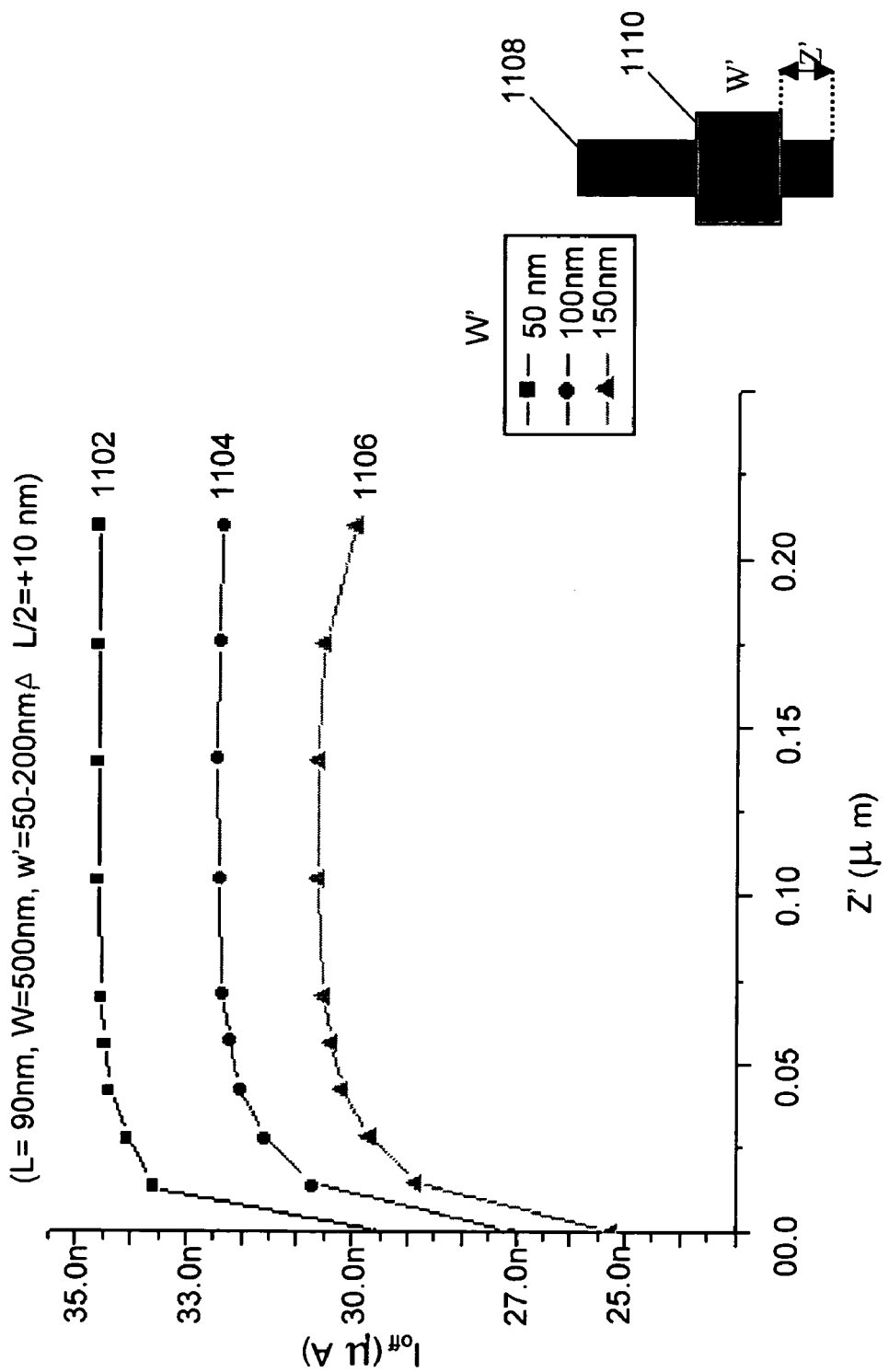
FIG. 11 is a graph illustrating a variation of leakage current ($t_{off}$) with respect to a set of allowable biases, in accordance with an embodiment of the present invention.

FIG. 11 is a graph illustrating a variation of leakage current ($I_{off}$) with respect to a set of allowable biases, in accordance with an embodiment of the present invention. FIG. 11 includes a curve 1102, a curve 1104, a curve 1106, a channel basic shape 1108, and a protrusion section 1110. As mentioned earlier, slices that are closer to the manufactured transistor gate edges typically suffer from narrow-width and well proximity effects. To reduce these effects and achieve a target objective such as minimum leakage current, the basic shape of the transistor channel is reshaped by the reshaping bias solution. Let L be the length of the channel at the edge of the transistor channel, and let ΔL represent the difference in channel length between the edge and the midpoint of the width W of the transistor channel. For example, if L=90 nm and ΔL/2=+10 nm, then the minimum gate length along the gate width is 70 nm at the center of the gate. Similarly, if ΔL/2=−10 nm, then the minimum gate length along the gate width is 110 nm at the center of the gate. In an embodiment of the present invention, reshaping of the basic shape of the transistor channel can be represented by a protruding section being added to the rectangular transistor channel. In this embodiment, the channel length at the midpoint, along the width in the protruding section, is greater than the channel length at the edge. Let W' represent the width of the protruding section. Again, let Z' represent the distance between the edge of the protruding section and the edge of the transistor channel. Curves 1102, 1104 and 1106 plot $I_{off}$ (Y-axis) versus Z' of a protruded section with widths of 50 nm, 100 nm and 150 nm, respectively. It can be seen from curves 1102, 1104 and 1106 that the value of $I_{off}$ decreases when the protruding section is added nearer to the transistor gate edge. Further, $I_{off}$ can be controlled by adding the protruding section to the basic shape of the channel. Thus, a target objective can be achieved by reshaping the basic shape of the channel, as further described in conjunction with FIG. 12.

Figure 12:
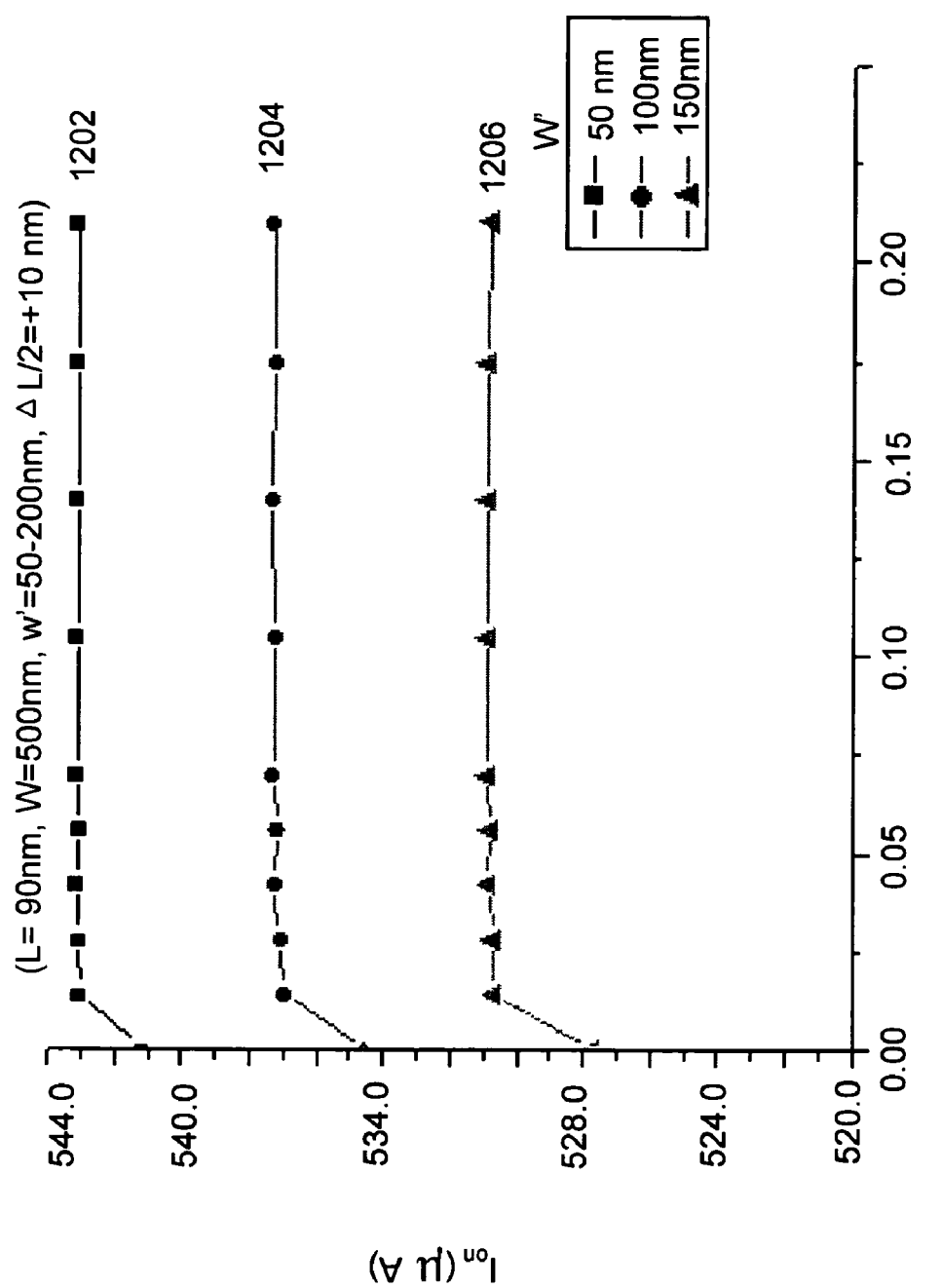
FIG. 12 is a graph illustrating the variation of a drive current ($I_{on}$) with respect to a set of allowable biases, in accordance with an embodiment of the present invention.

FIG. 12 is a graph illustrating the variation of a drive current ($I_{on}$) with respect to a set of allowable biases, in accordance with an embodiment of the present invention. The performance objective of the transistor is characterized by the $I_{on}$ of the transistor. FIG. 12 includes a curve 1202, a curve 1204, and a curve 1206. Curve 1202 represents the relationship between the $I_{on}$ and the Z' of a protruding section of width 50 nm. Similarly, curve 1204 represents the relationship between the $I_{on}$ and the Z' of a protruding section of width 100 nm. In the same manner, Curve 1206 represents the relationship between the $I_{on}$ and the Z' of a protruding section of width 150 nm. It is obvious from curves 1202, 1204 and 1206 that the value of $I_{on}$ decreases when the protruding section, is near the transistor gate edge.

It can be seen by the comparison of the graphs of FIG. 11 and FIG. 12 that the $I_{off}$ decreases more than the $I_{on}$ when protrusion section 1110 is closer to the transistor gate edges. Therefore, the $I_{off}$ can be reduced significantly with negligible impact on the $I_{on}$. Hence, the target objective of achieving a leakage objective with minimum impact on the performance objective is attained. In other words, the leakage current can be reduced significantly with minimal reduction in the drive current.

In accordance with an embodiment of the present invention, each of the set of allowable biases, along with corresponding expected manufactured performance parameters, is stored in a model. The model may be a look-up table or a fitted expression. In another embodiment of the present invention, the reshaping bias solution is chosen on the basis of a selection criterion, which is determined based on the target performance of a transistor. To achieve the target, the performance-reshaping solution is selected from a graph, which represents varying $I_{on}$ and $I_{off}$ for each of the set of allowable biases. Alternatively, fitted functions Jon(L, w) and Joff(L, w), where L is the length of the transistor channel at distance w from the edge, can also be used to construct the reshaping solutions.

Similar graphs can be obtained for other target objectives such as capacitance, reliability, manufacturing yield, and IC parametric yield. These graphs illustrate the variation of transistor metrics with respect to a set of allowable biases.

Various embodiments of the present invention offer the following advantages. Reshaping the basic shape of transistor channels leads to an Integrated Circuit (IC) that will have reduced leakage power without having a considerable impact on its performance characteristics. In addition the IC can also be designed with respect to reliability, capacitance, IC parametric yield and manufacturing yield. Various embodiments of the invention are in accordance with existing IC design processes (LOCOS and STI, etc.). The present invention is also capable of being used within the existing IC design cycle. Further, reshaping can be performed at the design stage in both full-custom and semi-custom design contexts.

The system for designing an integrated circuit, as described in the present invention, or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the steps that constitute the method of the present invention.

The computer system comprises a computer, an input device, a display unit, and the Internet. The computer comprises a microprocessor, which is connected to a communication bus. The computer also includes a memory, which may include Random Access Memory (RAM) and Read Only Memory (ROM). The computer system further comprises a storage device which can be a hard disk drive or a removable storage drive such as a floppy disk drive, optical disk drive, and so forth. The storage device can also be other similar means of loading computer programs or other instructions into the computer system.

The computer system executes a set of instructions that are stored in one or more storage elements, in order to process input data. The storage elements may also hold data or other information, as desired. The storage element may be in the form of an information source or a physical memory element present in the processing machine. Exemplary storage elements include hard disk, DRAM, SRAM and EPROM. The storage element may also be external to the computer system, and connected to or inserted into the computer, for download at or prior to the time of use. Examples of such external computer program products are computer-readable storage media such as CD-ROMS, flash chips, floppy disks, and so forth.

The set of instructions may include various commands that instruct the processing machine to perform specific tasks, such as the steps that constitute the method of the present invention. The set of instructions may be in the form of a software program. The software may be in various forms, such as system software or application software. Further, the software might be in the form of a collection of separate programs, a program module with a larger program, or a portion of a program module. The software might also include modular programming in the form of object-oriented programming. The software program containing the set of instructions can be embedded in a computer program product, for use with a computer. The computer program product comprising a computer-usable medium having a computer-readable program code embodied therein. The processing of input data by the processing machine may be in response to user commands or in response to results of previous processing, or in response to a request made by another processing machine.

While the foregoing is directed at embodiments of the present invention, other and further embodiments of the invention may be devised, without departing from the basic scope thereof, and the scope thereof is determined by the claims that follow.

What is claimed is:

1. An integrated circuit, the integrated circuit comprising a plurality of cells, each of the plurality of cells comprising a plurality of transistors, wherein a transistor channel of at least one transistor of the plurality of transistors has a non-rectangular shape, the non-rectangular shape of the transistor channel defined by a reshaping bias solution of the transistor based on a target objective and transistor characterization information, wherein the target objective includes one or both of a performance objective or a leakage objective and wherein the transistor characterization information defines dependence of a plurality of transistor metrics on positional and dimensional attributes of the transistor, the non-rectangular shape of the transistor channel selected to improve transistor metrics of the integrated circuit.

2. The integrated circuit of claim 1, wherein the non-rectangular shape is a T shape.

3. The integrated circuit of claim 1, wherein the non-rectangular shape is an I shape.

4. The integrated circuit of claim 1, wherein the non-rectangular shape is an X shape.

5. The integrated circuit of claim 1, wherein the non-rectangular shape is a protruding shape.

* * * * *